(12) United States Patent
Koshiyama et al.

(10) Patent No.: US 7,576,046 B2
(45) Date of Patent: Aug. 18, 2009

(54) CLEANING LIQUID FOR LITHOGRAPHY AND METHOD OF CLEANING THEREWITH

(75) Inventors: Jun Koshiyama, Kawasaki (JP); Yasumitsu Taira, Kawasaki (JP); Chima Shinohara, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 77 days.

(21) Appl. No.: 11/791,836

(22) PCT Filed: Dec. 26, 2005

(86) PCT No.: PCT/JP2005/023707
§ 371 (c)(1), (2), (4) Date: May 30, 2007

(87) PCT Pub. No.: WO2006/070709
PCT Pub. Date: Jul. 6, 2006

(65) Prior Publication Data
US 2008/0227678 A1  Sep. 18, 2008

(30) Foreign Application Priority Data
Dec. 28, 2004  (JP) .............................. 2004-382130

(51) Int. Cl.
C11D 7/26 (2006.01)
B08B 3/08 (2006.01)

(52) U.S. Cl. ..................... 510/171; 510/175; 510/176; 510/177; 134/1.3

(58) Field of Classification Search ................ 510/171, 510/175, 176, 177; 134/1.3
See application file for complete search history.

(56) References Cited

U.S. PATENT DOCUMENTS

| | | | | |
|---|---|---|---|---|
| 5,612,303 A * | 3/1997 | Takayanagi et al. | ......... | 510/174 |
| 5,789,359 A * | 8/1998 | Shimozawa et al. | ......... | 510/175 |
| 5,811,380 A * | 9/1998 | Weitz | ......... | 510/175 |
| 6,140,286 A * | 10/2000 | Watanabe et al. | ......... | 510/175 |
| 6,348,100 B1 * | 2/2002 | Cummings et al. | ......... | 134/1 |
| 6,524,775 B1 * | 2/2003 | Oberlander et al. | ......... | 430/327 |
| 6,544,942 B1 * | 4/2003 | Smith et al. | ......... | 510/417 |
| 6,569,251 B1 | 5/2003 | Takeda | | |
| 6,635,118 B2 * | 10/2003 | Sachdev et al. | ......... | 134/1 |
| 7,053,035 B2 * | 5/2006 | Hanada et al. | ......... | 510/407 |
| 7,105,265 B2 * | 9/2006 | Ohnishi et al. | ......... | 430/256 |
| 7,456,141 B2 * | 11/2008 | Hsu et al. | ......... | 510/175 |
| 2003/0171240 A1 * | 9/2003 | Hanada et al. | ......... | 510/407 |
| 2004/0063596 A1 * | 4/2004 | Gabric et al. | ......... | 510/176 |
| 2004/0116312 A1 * | 6/2004 | Schlicht et al. | ......... | 510/175 |
| 2004/0229762 A1 * | 11/2004 | Rutter, Jr. | ......... | 510/175 |
| 2007/0161530 A1 * | 7/2007 | Kaneda et al. | ......... | 510/176 |

FOREIGN PATENT DOCUMENTS

| | | |
|---|---|---|
| GB | 2 229 827 | 10/1990 |
| JP | 2-253265 | 10/1990 |
| JP | 4-42523 | 2/1992 |
| JP | 4-130715 | 5/1992 |
| JP | 4-49938 | 8/1992 |
| JP | 5-75110 | 10/1993 |
| JP | 8-137113 | 5/1996 |
| JP | 11-44960 | 2/1999 |
| JP | 11-218933 | 8/1999 |
| JP | 2001-117242 | 4/2001 |
| JP | 2001-188364 | 7/2001 |
| JP | 2003-114538 | 4/2003 |
| JP | 2003-195529 | 7/2003 |
| WO | 2004/107057 | 12/2004 |

OTHER PUBLICATIONS

Reg. No. 123-86-4, Nov. 16, 1984.*
Reg. No. 108-94-1, Nov. 16, 1984.*

* cited by examiner

Primary Examiner—Douglas MC Ginty
(74) Attorney, Agent, or Firm—Wenderoth, Lind & Ponack, L.L.P.

(57) ABSTRACT

A cleaning liquid for lithography that exhibits equally excellent cleaning performance for resists of a wide variety of compositions, such as various resists for i-line, KrF and ArF, silicic resist and chemical amplification type positive resist, and that excels in post-treatment dryability, being free from any deterioration of resist performance by cleaning. There is provided a cleaning liquid for lithography, comprising at least one member (A) selected from among lower alkyl esters of acetic acid and propionic acid and at least one member (B) selected from among ketones having 5 to 7 carbon atoms per molecule in a mass ratio of (A):(B) of 4:6 to 7:3.

2 Claims, 1 Drawing Sheet

CLEANING LIQUID FOR LITHOGRAPHY AND METHOD OF CLEANING THEREWITH

TECHNICAL FIELD

The present invention relates to a novel cleaning solution for lithography which shows a universally satisfactory rinse effect to any resist pattern formed by using resists of a great variety of different specifications, and to a method for forming a semiconductor base material therewith.

BACKGROUND TECHNOLOGY

Semiconductor base materials to be used for manufacturing electronic parts, liquid crystal display panels and the like are generally obtained by applying a photoresist on the surface of a silicon wafer to form a rest film. When the resist is applied, the resist adheres to the peripheral surface or back surface of the substrate and obstructs in the formation of a resist pattern which is undertaken in a subsequent step, so that it is necessary to previously clean and remove the extraneous resist.

As a cleaning solution used for this purpose, a solvent capable of efficiently dissolving and removing an extraneous resist and exhibiting quick dryability without affecting the characteristics of the cleaned resist film.

However, a great variety of different compositions of resists including those for ultraviolet light, i-line, KrF, ArF and the like are used for manufacturing semiconductor devices, and the resists even for the same wavelength include very wide varieties of products. Furthermore, resists having special compositions like silicon-containing resists are used for a special purpose, so that it is necessary to select an appropriate cleaning solution in accordance with each composition, and many cleaning solutions with different compositions have been heretofore proposed.

Such a cleaning solution includes, for instance, those consisting of a solvent based on an ethyleneglycol or an ester thereof (JP5-75110B); those consisting of propyleneglycol alkyl ether acetate (JP4-49938B); those consisting of alkyl 3-alkoxypropionate (JP4-42523A); those consisting of alkyl pyruvate (JP4-130715A); and the like.

In addition, a cleaning solution using a mixture of two kinds or more of solvents is known. The cleaning solution includes, for instance, those using a mixture of propyleneglycol alkyl ether, monoketone having 1 to 7 carbon atoms, and lactam or lactone (JP11-218933A); and a rinse solution consisting of n kinds of solvents satisfying $9 \leq \Sigma x_i \delta_i \leq 12$, where $x_i$ is defined as a mixed weight proportion of a component i and $\delta_i$ is defined as a solubility parameter calculated with a Fedors method (JP2003-114538A), and the like.

However, those rinse solutions show good cleaning effects against a specific resist, but do not always have good cleaning effects against the other resists. For instance, the mixture of propyleneglycol monomethyl ether acetate and methyl ethyl ketone shows good results against a chemical-amplification positive-working photoresist, but does not show good results against a resist for i-line and a silicon-containing resist. In addition, a rinse solution consisting of a mixture of ethyl lactate, butyl acetate and cyclohexanone shows good results against a resist consisting of a precursor of a photosensitive polybenzoxazole, but does not show good results against a resist for i-line.

Manufacturers of semiconductor devices adopt a collective pipeline system for centrally supplying the same cleaning solution to each production process or production line by a simple operation. In such operating circumstances, it requires enormous amounts of efforts and cost to change the cleaning solution for lithography to be used in each process or each production line, or to evaluate the cleaning effectiveness of the cleaning solution for lithography in each production line.

The pipeline system for supplying a cleaning solution for lithography to be arranged in a semiconductor-manufacturing apparatus has a limited number of pipes, so that the cleaning solution needs to have complete coverage of any applications, specifically including cleaning of the inside surface of a cup, cleaning of the peripheral surface of a substrate, cleaning of the back surface of a substrate, cleaning of a pipeline, rework cleaning, pre-wet cleaning, and the like.

DISCLOSURE OF THE INVENTION

The present invention has been made with an object to provide a cleaning solution for lithography capable of exhibiting an equally good cleaning effect and good dryability after treatment without affecting the characteristics of the resist for a great variety of resist compositions including those resists for i-line, KrF and ArF, silicon-containing resists, chemical-amplification positive-working resists, and the like.

The inventors have conducted extensive investigations on a cleaning solution for lithography, and have arrived at a discovery that a mixture of carboxylate with relatively low affinity to resists to be used and ketone shows excellent cleaning effects or, particularly, cleaning effects for a peripheral surface, when the proportion of the carboxylate in the mixture is relatively large, and besides, the effect does not depend on the objective composition of a resist, thus leading to completion of the present invention on the base of this discovery.

Namely, the present invention provides: a cleaning solution for lithography characterized by containing; (A) at least one kind selected from the group consisting of lower alkyl esters of acetic acid or propionic acid; and (B) at least one kind selected from the group consisting of ketones having 5 to 7 carbon atoms in a molecule in a mass proportion of (A):(B) in the range from 4:6 to 7:3; and a method for forming a semiconductor base material characterized by comprising forming a resist film by coating the substrate with a resist followed by spraying of the aforementioned cleaning solution for lithography at the extraneous resist adhering to the back surface or peripheral portions or both of the substrate to remove the same.

The cleaning solution for lithography according to the present invention contains a mixture of: a carboxylate having relatively low affinity to a resist film to be treated or, namely, (A) a lower alkyl ester of acetic acid or propionic acid; and a ketone having relatively high affinity to a resist film or, namely, (B) a ketone having 5 to 7 carbon atoms in a molecule.

The component (A) includes lower alkyl esters of lower carboxylic acids such as acetic acid and propionic acid of which those having the total carbon atoms in the range of 5 to 8 in a molecule are preferable.

The ester includes, for instance, acetates such as propyl acetate, butyl acetate and pentyl acetate, and propionates such as ethyl propionate, propyl propionate and butyl propionate. A propyl group, a butyl group and a pentyl group in the above-named esters can not only be of a straight chain but also can be of a branched chain. The particularly preferable components (A) are n-butyl acetate and isobutyl acetate.

As the component (B), ketones having the total carbon atoms in the range of 5 to 7 in a molecule are used. The ketone can be an acyclic ketone, or namely, those having a linear or branched alkyl group, or can be a cyclic ketone. Such an acyclic ketone includes, for instance, methyl pentyl ketone, methyl butyl ketone, methyl propyl ketone, diethyl ketone, ethyl propyl ketone, ethyl butyl ketone, dipropyl ketone, and the like. A propyl group, a butyl group and a pentyl group in the above-described ketones can be of either a straight chain or a branched chain.

In addition, the cyclic ketone includes, for instance, cyclopentanone, cyclohexanone, cycloheptanone, 2-methylcyclopentanone, 2-methylcyclohexanone, 2,5-dimethylcyclopentanone, and the like, of which cyclohexanone is preferable.

The lower limit of the number of carbon atoms contained in a molecule of the ketone is 5 and the upper limit thereof is 7. A ketone having smaller than 5 carbon atoms in a molecule of the ketone has greater affinity to the resist and removal of the resist film on a substrate extends overly to necessary parts beyond the extraneous part on the substrate in the cleaning step. To the contrary, a ketone having more than 7 carbon atoms in a molecule of the ketone hardly removes the extraneously deposited part of the resist film.

A mixing proportion of the component (A) to the component (B) in the cleaning solution for lithography according to the present invention is, in a mass proportion of (A):(B), in the range from 4:6 to 7:3 or, preferably, from 5:5 to 6:4. When the proportion of the component (A) is smaller than the above-mentioned range, the cleaning solution cannot sufficiently remove an extraneous resist composition on the peripheral surface during cleaning while, when in excess over the upper limit of the component (A), the cleaning solution causes spots on cleaned part and/or uneven film thickness. The most preferable composition is an equal-amount mixture of the component (A) and the component (B).

In order to remove an extraneous resist composition on a substrate by using the cleaning solution for lithography according to the present invention, it is recommended to apply a desired resist onto one surface of the substrate, for instance, by the spin-coating method, followed by spraying with the cleaning solution for lithography onto the peripheral surface of a substrate and/or the other surface of the substrate through a nozzle, so as to clean and remove the extraneous part of a resist film, and then drying by standing.

It can be confirmed by visual inspection whether an extraneous part has been removed or not, but when the cleaning solution is used in a process for preparing a semiconductor base material to form a fine resist pattern, a method is advantageous in which a resist film is irradiated with light followed by development and heat treatment of the resist film of which the surface is scanned with a stylus to record an enlarged pattern of the cross sectional profile where the presence or absence of a peak formed on the peripheral surface can be observed.

BEST MODE FOR CARRYING OUT THE INVENTION

In the next place, the best mode for carrying out the present invention will be described by way of Examples, but the present invention is not limited by these Examples.

Example 1

A silicon wafer having a diameter of 200 mm was spin-coated with a resist for i-line (a product name "THMR-iP3650", a product of Tokyo Ohka Kogyo Co.) on a spinner (Model "DNS D-SPIN", manufactured by Dainippon Screen Mfg. Co.) at a rotation of 2,500 rpm for 10 seconds to form a resist film having a film thickness of 1.35 μm which was heat-treated at 60° C. for 80 seconds.

Subsequently, a lithographic cleaning solution A, which was prepared by mixing 50 parts by mass of n-butyl acetate and 50 parts by mass of cyclohexanone, was sprayed at 25° C. at a rate of 10 ml/minute through a nozzle arranged at a position of 5 mm apart from a wafer peripheral surface followed by cleaning the peripheral surface of the resist film, and then air-drying for 30 seconds.

Figure 1:
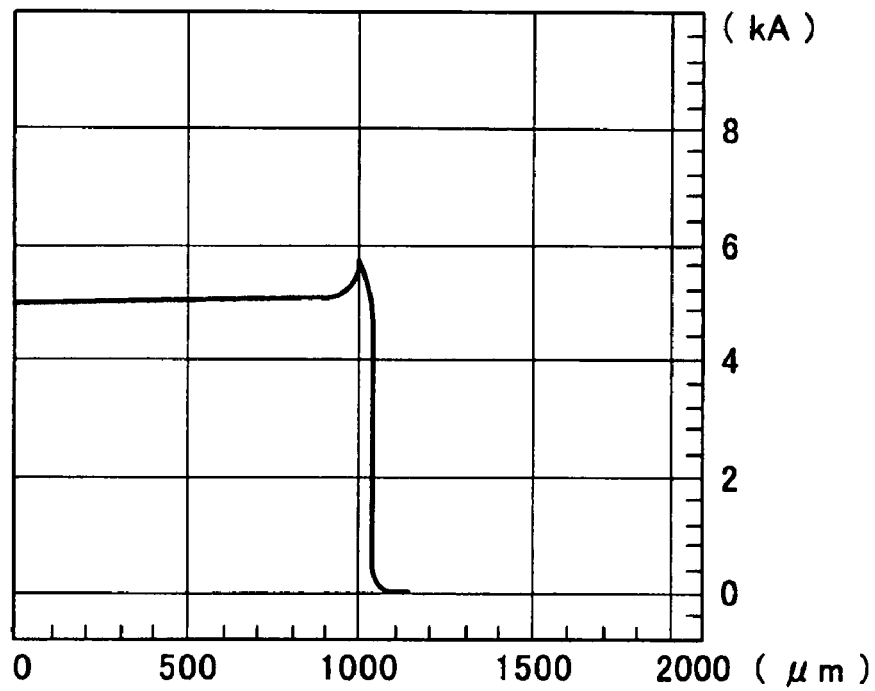
FIG. 1 is a graph showing an enlarged pattern in a cross sectional direction of the peripheral surface of a resist film treated in Example 1.

The thus treated peripheral surface of the resist film was scanned with a stylus surface profiler (Model "DEKTAK8", manufactured by Ulvac, Inc.) to form an enlarged pattern in a cross-sectional direction. The result is shown in FIG. 1.

As is clear from the figure, the height of an extraneous residual part on a peripheral surface was only 2% of the film thickness, which means that the extraneous part was almost completely removed.

Moreover, the surface of the resist film was almost flat except the peripheral surface, and a harmful effect by cleaning treatment was not recognized.

Comparative Example 1

Figure 2:
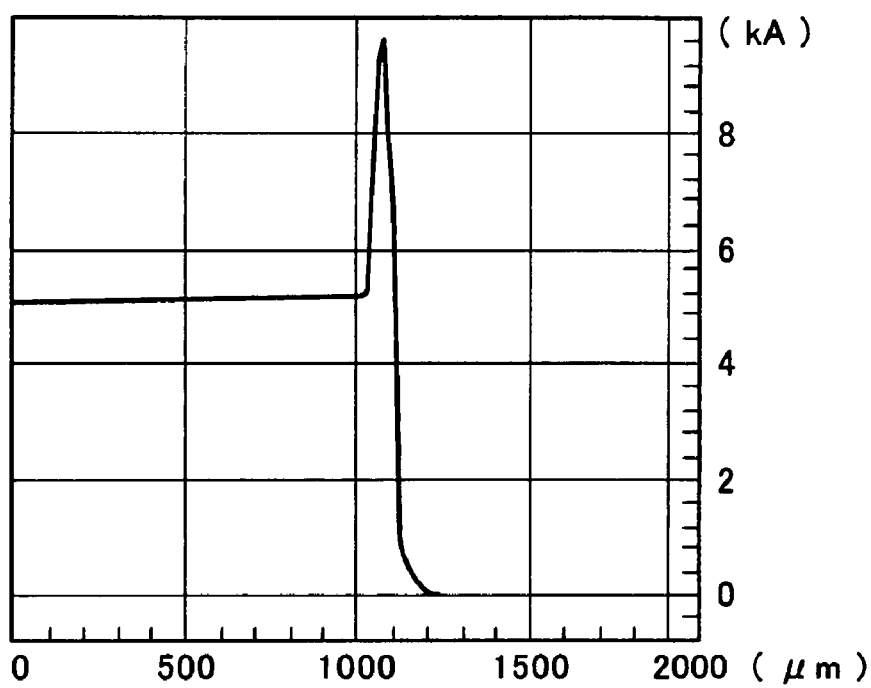
FIG. 2 is a graph showing an enlarged pattern in a cross sectional direction of the peripheral surface of a resist film treated in Comparative Example 1.

Cleaning treatment procedure of a silicon wafer was conducted in the same manner as in Example 1 excepting for the use of a cleaning solution prepared by mixing 30 parts by mass of n-butyl acetate and 70 parts by mass of hexanone in place of the inventive cleaning solution followed by scanning of the peripheral surface of the resist film. The result is shown in FIG. 2.

As is clear from the figure, an extraneous part with a height corresponding to 80% of the original film thickness remained on the peripheral surface, which means that the cleaning effect was insufficient.

Referential Example 1

A silicon wafer with a diameter of 200 mm was coated with a resist for ArF (a product name "TArF-P6111", a product of Tokyo Ohka Kogyo Co.), a resist for KrF (a product name "TDUR-P015", a product of Tokyo Ohka Kogyo Co.) or a resist for i-line (previously described) in the same manner as in Example 1 followed by heat treatment at 100° C. for 60 seconds to form three kinds of resist films each having a film thickness shown in Table 1.

Subsequently, three kinds of the resist films were cleaned with the cleaning solution A used in Example 1, a lithographic cleaning solution B consisting of 70 parts by mass of propyleneglycol monomethyl ether and 30 parts by mass of propyleneglycol monomethyl ether acetate, cyclohexanone (cleaning solution C) or ethyl lactate (cleaning solution D), at 25° C. at a rotation of 1,200 rpm for 20 seconds on the same spinner as in Example 1 followed by drying at 3,000 rpm for 10 seconds, respectively.

Subsequently, a remaining amount (μm) of each of the thus treated resist films was measured. The results are shown in Table 1.

TABLE 1

| Type of resist | | ArF resist | KrF resist | i-line resist |
|---|---|---|---|---|
| Original film thickness, μm | | 1.52 | 4.36 | 4.46 |
| Residual | Cleaning solution A | 0.02 | 0.00 | 0.00 |

TABLE 1-continued

| | Type of resist | ArF resist | KrF resist | i-line resist |
|---|---|---|---|---|
| film thickness, μm | Cleaning solution B | 1.32 | 0.00 | <0.01 |
| | Cleaning solution C | 0.10 | 0.08 | 3.46 |
| | Cleaning solution D | 1.30 | 0.57 | 3.28 |

As is clear from Table 1, each of the typical conventional cleaning solutions B to D shows specific solubility to each type of a resist to be used, whereas the lithographic cleaning solution A according to the present invention shows superior solubility to any resist regardless of the type.

Example 2

A silicon wafer was spin-coated with three kinds of the resists used in Reference Example 1 or a Si-containing resist (a product name "TDUR-SC011", a product of Tokyo Ohka Kogyo Co.) in the same manner as in Example 1 to form a resist film and then the peripheral surface of the substrate was subjected to a cleaning test in the same manner as in Example 1 by using each of the cleaning solutions A to D used in Reference Example 1 so as to evaluate the appearance by visual inspection according to the following criteria. The results are shown in Table 2.

TABLE 2

| Type of resist | | i-line resist | KrF resist | ArF resist | Si-containing resist |
|---|---|---|---|---|---|
| Type of cleaning solution | A | +++ | +++ | +++ | +++ |
| | B | ++ | ++ | ++ | +++ |
| | C | ++ | +++ | +++ | ++ |
| | D | + | ++ | ++ | +++ |

Remarks)
+++: No residues recognizable on the peripheral surface.
++: Some stain-like residues recognizable on the peripheral surface.
+: A large quantity of residues recognizable on the peripheral surface.

As is clear from Table 2, each of the typical conventional cleaning solutions B to D has a cleaning and removing effect for the peripheral surface, depending on the type of the objective resist, in other words, can be used for a certain type of a resist but not for the other types, whereas the inventive lithographic cleaning solution A shows excellent effects on removal of the extraneous part on the peripheral surface of any resist regardless of the type.

Example 3

Each of lithographic cleaning solutions with mixing proportions shown in Table 3 was prepared by using n-butyl acetate as the component (A) and cyclohexanone as the component (B), and cleaning and removing tests for the extraneous part on the peripheral surface were conducted using these cleaning solutions in the same manner as in Example 1. The results are shown in Table 3.

TABLE 3

| Sample No. | Mixing ratio (mass proportion) (A):(B) | Ratio of height against film thickness of residual material on peripheral surface, % |
|---|---|---|
| 1 | 2:8 | 55% |
| 2 | 4:6 | 4.0% |
| 3 | 6:4 | 2.5% |
| 4 | 8:2 | 20% |

As is clear from Table 3, the cleaning solution containing a too small amount of the component (A), i.e. the sample 1, and the cleaning solution containing an excess amount of the component (A), i.e. the sample 4, show a decreased removal rate for the extraneous part on the peripheral surface.

Example 4

Cleaning treatment procedure of a silicon wafer was conducted in the same manner as in Example 1 excepting for the use of a lithographic cleaning solution E or F consisting of an equal-amount mixture of n-propyl acetate or ethyl propionate and cyclohexanone in place of the cleaning solution A in Example 1 and the removed condition of an extraneous part on a peripheral surface was evaluated by visual inspection. The results are shown in Table 4 in which the criteria are same as in Table 2.

Comparative Example 2

Cleaning treatment procedure of a silicon wafer was conducted in the same manner as in Example 1 excepting for the use of a lithographic cleaning solution G or H consisting of an equal-amount mixture of n-butyl butyrate or ethyl formate and cyclohexanone in place of the cleaning solution A in Example 1, and the removed condition of an extraneous part on a peripheral surface was evaluated by visual inspection. The results are shown in Table 4.

Example 5

Cleaning treatment procedure of a silicon wafer was conducted in the same manner as in Example 1 excepting for the use of a lithographic cleaning solution I or J consisting of an equal-amount mixture of n-butyl acetate and diethyl ketone or ethyl butyl ketone in place of the cleaning solution A in Example 1, and the removed condition of an extraneous part on a peripheral surface was evaluated by visual inspection. The results are shown in Table 4.

Comparative Example 3

Cleaning treatment procedure of a silicon wafer was conducted in the same manner as in Example 1 excepting for the use of a lithographic cleaning solution K or L consisting of an equal-amount mixture of n-butyl acetate and acetone or dibutyl ketone in place of the cleaning solution A in Example 1, and the removed condition of an extraneous part on a peripheral surface was evaluated by visual inspection. The results are shown in Table 4.

TABLE 4

| Type of cleaning solution | i-line resist | KrF resist | ArF resist | Si-containing resist |
|---|---|---|---|---|
| E | +++ | +++ | +++ | +++ |
| F | +++ | +++ | +++ | +++ |
| G | +++ | ++ | ++ | +++ |
| H | + | ++ | +++ | +++ |
| I | +++ | +++ | +++ | +++ |
| J | +++ | +++ | +++ | +++ |
| K | +++ | +++ | + | ++ |
| L | +++ | +++ | + | ++ |

As is understood from Table 4, each of the typical conventional cleaning solutions (cleaning solutions G, H, K and L) have cleaning and removing effects for the peripheral surface, depending on the type of the objective resist, in other words, can be used for a certain type of a resist but not for the other types, whereas the inventive lithographic cleaning solutions (cleaning solutions E, F, I and J) show excellent effects on removal of the extraneous part on the peripheral surface of any resist regardless of the type.

INDUSTRIAL APPLICABILITY

The cleaning solution for lithography according to the present invention has advantages that efficient cleaning and removal of an extraneous part of a resist can be undertaken after application of a resist, regardless of the resist film compositions, so that there is no need to select a suitable cleaning solution for each objective resist to be cleaned and also quick dryability can be accomplished after the cleaning treatment.

In coating of a substrate with a resist, furthermore, the cleaning solution for lithography according to the present invention is not only particularly effective for removing extraneous parts of a resist adhering onto peripheral surfaces and/or the opposite surface so as to prevent product defects occurring due to the presence of the extraneous parts, but also can be utilized in many applications such as pipeline cleaning, rework cleaning, pre-wetting, and others.

The invention claimed is:

1. A cleaning solution for lithography consisting of: (A) butyl acetate and (B) cyclohexanone, in a mass proportion of (A):(B) in the range from 4:6 to 7:3.

2. A method for the formation of a semiconductor base material by forming a resist film by coating the semiconductor substrate with a resist followed by spraying of the cleaning solution for lithography described in claim 1 at extraneous resist adhering to the back surface or peripheral portions or both of the semiconductor substrate to remove the same.

* * * * *